(12) United States Patent
Hwang et al.

(10) Patent No.: US 9,520,235 B2
(45) Date of Patent: Dec. 13, 2016

(54) CLAD METAL BUS BAR FOR FILM CAPACITOR AND FILM CAPACITOR COMPRISING THE SAME

(71) Applicant: HYUNDAI MOBIS CO., LTD., Seoul (KR)

(72) Inventors: Deuk Kyu Hwang, Yongin-si (KR); Yong Chun, Yongin-si (KR); Kee Yang Lee, Hwaseong-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 151 days.

(21) Appl. No.: 14/543,691

(22) Filed: Nov. 17, 2014

(65) Prior Publication Data

US 2015/0380908 A1    Dec. 31, 2015

(30) Foreign Application Priority Data

Jun. 30, 2014    (KR) ........................ 10-2014-0080751

(51) Int. Cl.
| | | |
|---|---|---|
| *H01G 4/232* | (2006.01) | |
| *H01G 4/228* | (2006.01) | |
| *H01G 4/33* | (2006.01) | |
| *H01G 2/04* | (2006.01) | |
| *H01G 2/10* | (2006.01) | |
| *H01G 4/224* | (2006.01) | |
| *H05K 7/02* | (2006.01) | |
| *H01G 4/32* | (2006.01) | |

(52) U.S. Cl.
CPC .............. *H01G 4/2325* (2013.01); *H01G 2/04* (2013.01); *H01G 2/106* (2013.01); *H01G 4/224* (2013.01); *H01G 4/33* (2013.01); *H05K 7/02* (2013.01); *H01G 4/32* (2013.01)

(58) Field of Classification Search
CPC ........ H01G 4/32; H01G 4/2325; H01G 4/232; H01G 4/228
See application file for complete search history.

(56) References Cited

U.S. PATENT DOCUMENTS

| 6,704,189 B2 * | 3/2004 | Yoshii ..................... H01C 1/144 361/306.1 |
| 7,518,896 B2 * | 4/2009 | Cheah ................. H02M 7/2176 323/266 |
| 8,416,556 B2 * | 4/2013 | Grimm .................. H01G 4/224 361/301.1 |
| 2008/0196924 A1 * | 8/2008 | Beulque ................. H02G 5/005 174/117 A |

FOREIGN PATENT DOCUMENTS

KR    10-2006-0035057 A    4/2006

* cited by examiner

*Primary Examiner* — Eric Thomas
(74) *Attorney, Agent, or Firm* — Knobbe Martens Olson & Bear LLP

(57) ABSTRACT

A clad metal bus bar for a film capacitor may include a clad metal layer including: an aluminum layer; a first copper layer stacked on one surface of the aluminum layer; and a second copper layer stacked on the other surface of the aluminum layer.

10 Claims, 4 Drawing Sheets

Fig. 4A  Example 1

Fig. 4B  Example 2

Fig. 4C  Comparative Example 2

Fig. 4D  Comparative Example 3

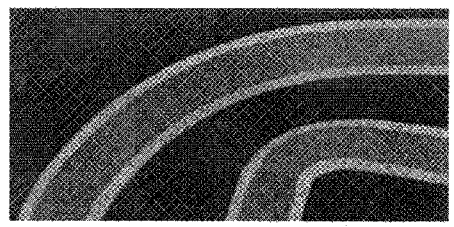
Fig. 5A Example 3
Fig. 5B Example 3
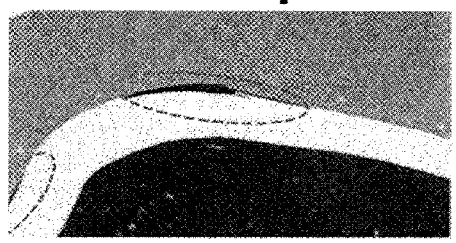
Fig. 5C Comparative Example 3
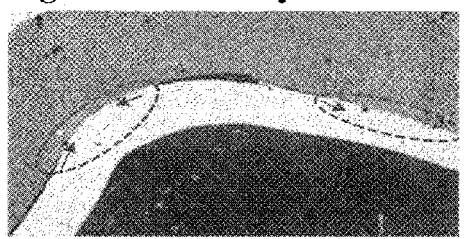
Fig. 5D Comparative Example 3
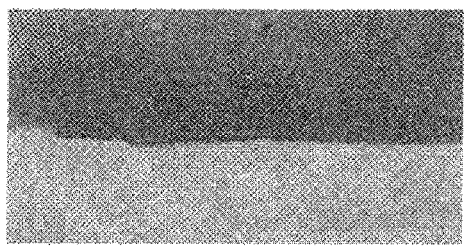
Fig. 6A Example 1
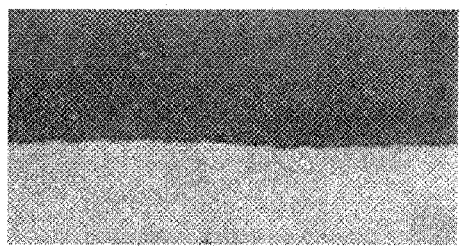
Fig. 6B Example 2
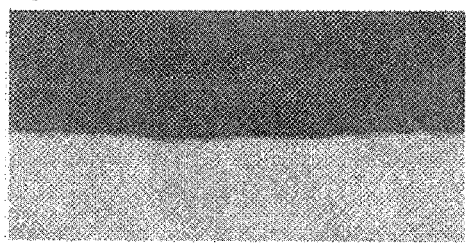
Fig. 6C Example 3
Fig. 6D Comparative Example 3

CLAD METAL BUS BAR FOR FILM CAPACITOR AND FILM CAPACITOR COMPRISING THE SAME

CROSS-REFERENCES TO RELATED APPLICATIONS

The present application claims priority to Korean application number 10-2014-0080751, filed on Jun. 30, 2014, which is incorporated by reference in its entirety.

BACKGROUND

The present disclosure relates to a clad metal bus bar for a film capacitor and a film capacitor including the same. More specifically, the present invention relates to a clad metal bus bar for a film capacitor, which can be reduced in weight while exhibiting excellent bond strength and having various properties of electrical resistance, tightening torque, and temperature rise, and a film capacitor including the same.

A hybrid electric vehicle (HEV) requires electrical parts which are not used by a general engine vehicle or electric vehicle. Furthermore, as a driving motor, a generator, and a battery are added, the HEV requires a power supply system of 12V to 42V and a high voltage system of 144V to 400V. In particular, as large electrical energy is needed, high-voltage high-current design which has not been considered and a high-voltage high-current capacitor which is applied to a power conversion system and a DC-DC inverter circuit are required to be developed. Furthermore, when the HEV is driven and started, an electric motor supplies energy, and when the HEV is stopped, an auxiliary energy storage device collects the energy.

The related art of the present invention is disclosed in Korean Patent Laid-open Publication No. 2006-0035057 published on Apr. 26, 2006 and entitled "Cu—Al Clad Bus Bar with Ag-Coating and Manufacturing Methods thereof".

SUMMARY

In one embodiment, a clad metal bus bar for a film capacitor may include a clad metal layer including: an aluminum layer; a first copper layer stacked on one surface of the aluminum layer; and a second copper layer stacked on the other surface of the aluminum layer. The thicknesses of the first and second copper layers may be set in the range of about 10% to about 25% of the entire thickness of the clad metal layer, and the thickness of the aluminum layer may be set in the range of about 50% to about 70% of the entire thickness of the clad metal layer. The clad metal layer may have a percentage reduction in thickness of less than about 10% and an elongation percentage of about 25% or more, and the bond strength of the clad metal layer, measured on the basis of ISO 11339, may be equal to or higher than about 10 kgf or more, based on a specimen width of 25 mm.

The thickness ratio of the first copper layer to the second copper layer may be set in the range of about 1:0.5 to about 1:1.5.

The thicknesses of the first and second copper layers may be set in the range of about 15% to about 25% of the entire thickness of the clad metal layer, and the cross-sectional thickness of the aluminum layer may be set in the range of about 50% to about 65% of the entire thickness of the clad metal layer.

The thickness ratio of the first or second copper layer to the aluminum layer may be set in the range of about 1:3 to about 1:8.

The first and second thickness layers may have a thickness of about 0.05 mm to about 0.5 mm, and the aluminum layer may have a thickness of about 0.3 mm to about 2.0 mm.

The clad metal bus bar may have a thickness of about 0.5 mm to about 2.5 mm.

The ratio of the percentage reduction in thickness to the elongation percentage of the clad metal layer may be set in the range of about 1:2 to about 1:15.

The clad metal bus bar may have an electrical conductivity of about 60 IACS % or more.

The clad metal layer may have an elongation percentage of about 25% to about 35%.

BRIEF DESCRIPTION OF THE DRAWINGS

FIGS. 4A to 4D illustrate bending test results of examples and comparative examples, when a radius curvature R is set to 0.5.

FIGS. 5A and 5B are photographs showing the cross-sections of the bus bars in accordance with the examples, before and after the thermal shock test.

FIGS. 5C and 5D are photographs showing the cross-sections of the bus bars in accordance with the comparative examples, before and after the thermal shock test.

FIGS. 6A to 6D are photographs showing the interface between the copper layer and the aluminum layer in the bus bars in accordance with the examples and the comparative examples, after a heat treatment.

DETAILED DESCRIPTION

Figure 1:
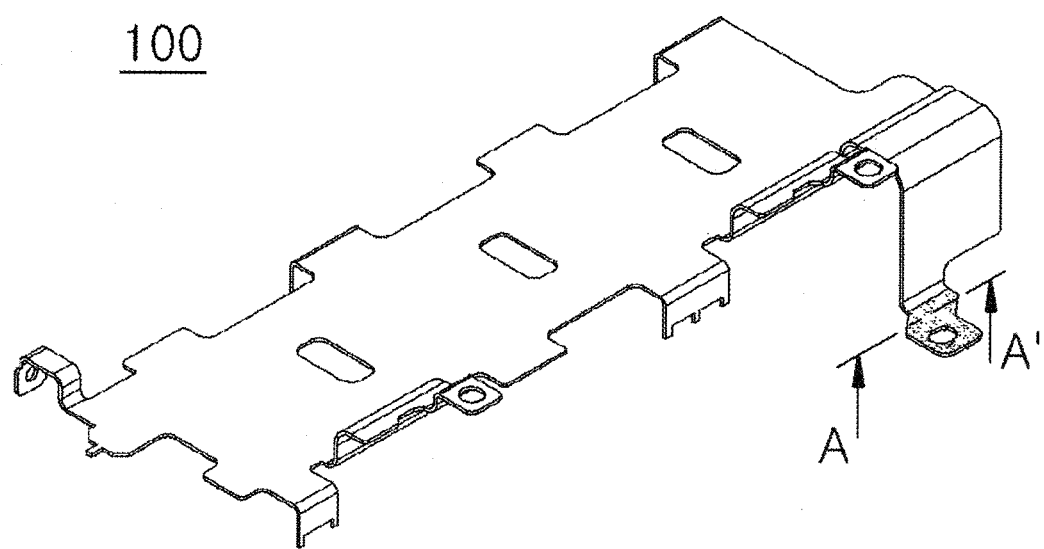
FIG. 1 illustrates a clad metal bus bar in accordance with one embodiment of the present invention.

While the present invention is described, detailed descriptions related to well-known functions or configurations will be ruled out in order not to unnecessarily obscure subject matters of the present invention. Furthermore, the terms as used herein are defined by taking functions of the invention into account and can be changed according to the custom or intention of users or operators. Therefore, definition of the terms should be made according to the overall disclosures set forth herein.

A bus bar refers to a plate-shaped electrical part which electrically connects electronic parts and serves as a current path. In the case of vehicle parts having a space restriction, a bus bar is generally used to design a structure for electrically connecting and supporting the parts. In particular, a film capacitor which is an inverter part for a hybrid vehicle uses a bus bar to support and electrically connect a deposited film.

A film capacitor which is an inverter part for a vehicle uses a plated-shape bus bar with a large area, in order to support and electrically connect a deposited film. In general, the bus bar is formed of copper (Cu) which is suitable for press processing and has high electrical conductivity. Typically, tough pitch cooper (C1100) is applied. That is because Cu has a high fusion point of 1084° C. and an excellent electrical conductivity of 98 IACS % to 100 IACS %, and is suitable for press processing. However, the bus bar formed of Cu has problems in that Cu is expensive and has a high specific gravity of 8.94 g/cm³. Thus, when the bus bar is manufactured only of pure Cu, the bus bar may be too heavy to handle.

A capacitor included in the film capacitor may be manufactured by the following process: a plastic film is used as a dielectric material, a film obtained by depositing a metal on one surface or both surfaces of the plastic film is wound, and zinc, zinc alloy, arsenic or zinc-arsenic is metalized on both surfaces of the wound deposited film so as to form metalized surfaces. The plastic film includes various types of resins such as polyethylene terephthalate (PET), polypropylene (PP), polyethylene naphthalate (PEN), polycarbonate (PC), polyphenylene sulfide (PPS) and the like. Furthermore, according to the use of the capacitor, a plurality of capacitor elements may be coupled to an N-pole bus bar and a P-pole bus bar, and inserted into a case formed of plastic or metal. Then, in order to protect and insulate the inside of the capacitor, the capacitor may be filled with a molding material such as epoxy or urethane or a multilayer of heterogeneous molding materials such as epoxy and urethane.

When a high voltage or high current is applied to the film capacitor, the film capacitor generates heat. The heat generated from the film capacitor may degrade the electrical characteristic thereof, and reduce the lifetime and reliability thereof. Recently, parts used in a vehicle have been required to be reduced in weight. Thus, a bus bar for a film capacitor included in a vehicle may also be required to be reduced in weight, while satisfying a physical property of the bus bar formed of Cu.

Figure 3:
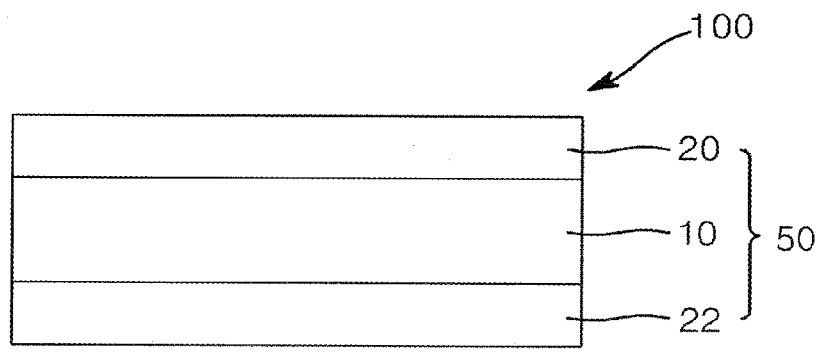
FIG. 3 is a cross-sectional view of the clad metal bus bar, taken along A-A' of FIG. 1.
Figure 3:
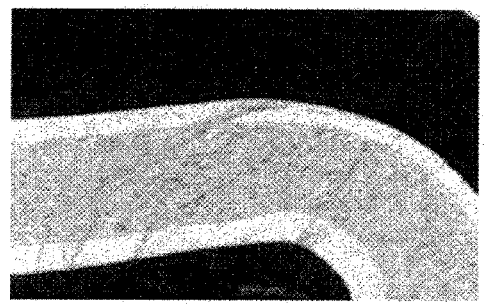
Figure 3:
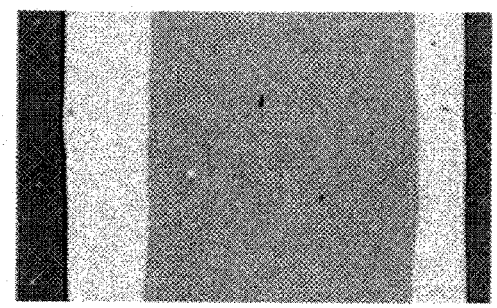
Figure 3:
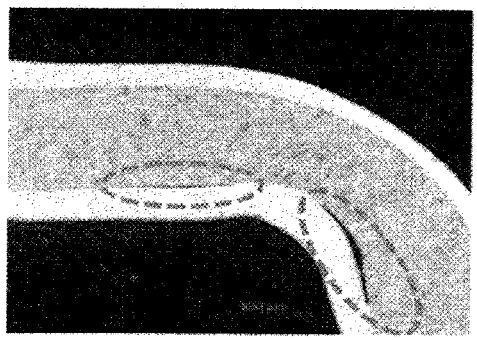
Figure 3:
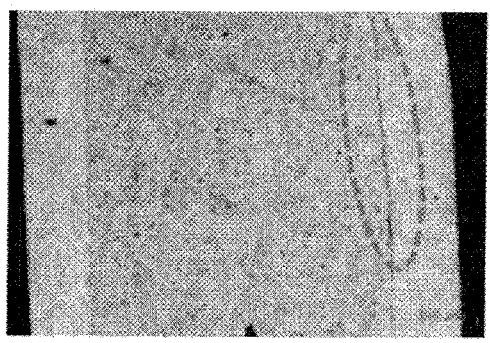

One aspect of the present invention relates to a clad metal bus bar for a film capacitor. FIG. 1 illustrates a clad metal bus bar in accordance with an embodiment of the present invention. FIG. 3 is a cross-sectional view of the clad metal bus bar, taken along A-A' of FIG. 1. Referring to FIGS. 1 and 3, the clad metal bus bar 100 may include a clad metal layer 50 which includes an aluminum layer 10 having a predetermined thickness, a first copper layer 20 stacked at a predetermined thickness on one surface of the aluminum layer 10, a second copper layer 22 stacked at a predetermined thickness on the other surface of the aluminum layer 10. When the clad metal bus bar 100 includes the aluminum layer 10 between the first and second copper layers 20 and 22 as described above, the clad metal bus bar 100 may be reduced in weight.

In one embodiment, the clad metal layer 50 may be rolled at a percentage reduction in thickness of less than about 10%. In the present specification, "percentage reduction in thickness" indicates a thickness difference of the clad metal layer between before and after rolling. When the clad metal layer 50 is manufactured at the above-described percentage reduction in thickness, the bus bar in accordance with the embodiment of the present invention may have excellent formability, hardness, and mechanical strength such as bond strength. On the other hand, when a percentage reduction in thickness of about 10% or more is applied, the formability, hardness, and the mechanical strength may be degraded.

For example, the clad metal layer 50 may be manufactured at a percentage reduction in thickness of about 0% to about 10%. In one embodiment, the clad metal layer 50 may be manufactured at a percentage reduction in thickness of about 0% to about 8%. In a specific embodiment, the clad metal layer 50 may be manufactured at a percentage reduction in thickness of about 0%. For example, the clad metal layer 50 may be manufactured at a percentage reduction in thickness of 0% to 8%. In specification, "the percentage reduction in thickness of 0%" may define that an annealed material is used. In a specific embodiment, the clad metal layer 50 may be manufactured at a percentage reduction in thickness of about 0, 0.01, 0.1, 0.5, 1, 2, 3, 4, 5, 6, 7, 8, 9, 9.5, or 9.9%.

In one embodiment, the clad metal layer 50 may have an elongation percentage of about 25% or more. In the above-described range, the hardness and the mechanical strength such as bond strength may be improved while the formability is secured. When an elongation percentage of about 25% or less is applied, the formability, hardness, and mechanical strength of the bus bar in accordance with the embodiment of the present invention may be degraded. In the present embodiment, the elongation percentage may be measured on the basis of ISO 6892. For example, the clad metal layer 50 may have an elongation percentage of about 25% to about 35%. In one embodiment, the clad metal layer 50 may have an elongation percentage of about 25% to about 35%. For example, the clad metal layer 50 may have an elongation percentage of about 25, 26, 28, 27, 28, 29, 30, 31, 32, 33, 34, or 35%.

In one embodiment, the ratio of percentage reduction in thickness to elongation percentage of the clad metal layer 50 may be set in the range of about 1:2 to about 1:15. In the above-described range, the bus bar in accordance with the embodiment of the present invention may have excellent formability and bond strength, interface debonding and crack may be substantially prevented from occurring during a bending process, and a film capacitor may have equivalent series resistance (ESR). For example, the ratio of percentage reduction in thickness to elongation percentage of the clad metal layer 50 may be set in the range of about 1:2.5 and about 1:5. For example, the ratio of percentage reduction in thickness to elongation percentage of the clad metal layer 50 may be set in the range of about 1:3 and about 1:4.5.

In a specific embodiment, the bond strength of the clad metal layer 50, measured on the basis of ISO 11339, may be equal to or higher than about 10 kgf, based on a specimen width of 25 mm. In the above-described range, the electrical conductivity and thermal shock resistance of the clad metal layer 50 may be improved, while interface debonding and crack is substantially prevented from occurring during a bending process for manufacturing a bus bar for a film capacitor. Furthermore, since the interface debonding and crack is substantially prevented during the bending process, the film capacitor in accordance with the embodiment of the present invention may have a low ESR value. When the bond strength of the clad metal layer 50 is less than about 10 kgf, interface debonding and crack may occur during the bending process. For example, the clad metal layer 50 may have a bond strength of about 15 kgf or more. In one embodiment, the clad metal layer 50 may have a bond strength of about 10 kgf to about 20 kgf. In a specific embodiment, the clad metal layer 50 may have a bond strength of about 10, 11, 12, 13, 14, 15, 16, 17, 18, 19, or 20 kgf.

In a specific embodiment, the cross-sectional thicknesses of the first and second copper layers 20 and 22 may be set in the range of about 10% to about 25% of the entire thickness of the clad metal layer 50, and the cross-sectional thickness of the aluminum layer 10 may be set in the range of about 50% to about 70% of the entire thickness of the clad metal layer 50. In the above-described thickness range, the clad metal layer 50 may have an excellent lightweight property, and secure properties such as electrical resistance and tightening torque.

When the thickness of the first copper layer 20 is less than about 10% of the entire thickness of the clad metal layer 50, the electrical conductivity and formability of the bus bar in accordance with the embodiment of the present invention may be degraded, and when the thickness of the first copper layer 20 is more than about 25% of the entire thickness of the clad metal layer 50, the lightweight property of the bus bar may be degraded.

When the thickness of the second copper layer 22 is less than about 10% of the entire thickness of the clad metal layer 50, the electrical conductivity and formability of the bus bar in accordance with the embodiment of the present invention may be degraded, and when the thickness of the second copper layer 22 is more than about 25% of the entire thickness of the clad metal layer 50, the lightweight property of the bus bar may be degraded.

When the thickness of the aluminum layer 10 is less than about 50% of the entire thickness of the clad metal layer 50, the lightweight property and formability of the bus bar in accordance with the embodiment of the present invention may be degraded, and when the thickness of the aluminum layer 10 is more than about 70% of the entire thickness of the clad metal layer 50, the electrical conductivity of the bus bar may be degraded.

For example, the cross-sectional thicknesses of the first and second copper layers 20 and 22 may be set in the range of about 15% to about 25% of the entire thickness of the clad metal layer 50, and the cross-sectional thickness of the aluminum layer 10 may be set in the range of about 50% to about 65% of the entire thickness of the clad metal layer 50.

In one embodiment, the cross-sectional thickness of the first and second copper layers 20 and 22 may be set in the range of about 22% to about 25% of the entire thickness of the clad metal layer 50, and the cross-sectional thickness of the aluminum layer 10 may be set in the range of about 53% to about 56% of the entire thickness of the clad metal layer 50.

In one embodiment, the cross-sectional thickness of the first copper layer 20 may be set to about 10, 11, 12, 13, 14, 15, 16, 17, 18, 19, 20, 21, 22, 23, 24, or 25% of the entire thickness of the clad metal layer 50. Furthermore, the cross-sectional thickness of the second copper layer 22 may be set to about 10, 11, 12, 13, 14, 15, 16, 17, 18, 19, 20, 21, 22, 23, 24, or 25% of the entire thickness of the clad metal layer 50. Furthermore, the cross-sectional thickness of the aluminum layer 10 may be set to about 50, 51, 52, 53, 54, 55, 56, 57, 58, 59, 60, 61, 22, 63, 64, 65, 66, 67, 68, 69 or 70% of the entire thickness of the clad metal layer 50.

In the embodiment of the present invention, aluminum forming the aluminum layer 10 is not specifically limited. For example, pure aluminum such as A1050 or A1100 may be used, or an alloy of aluminum and magnesium, manganese, or silicon, such as A3003, A3004, or A5005, may be used. For example, pure aluminum such as A1050 may be used in consideration of press workability.

In the embodiment of the present invention, copper forming the first and second copper layers 20 and 22 is not specifically limited. However, pure copper such as C1100 or an alloy of copper and heterogeneous metal may be used. In a specific embodiment, the first and second copper layers 20 and 22 may be formed of the same material or different materials.

In a specific embodiment, the first and second copper layers 20 and 22 may be formed at a thickness ratio of about 1:0.5 to about 1:1.5. In the above-described range, the bus bar in accordance with the embodiment of the present invention may have excellent electrical resistance and tightening torque. For example, the first and second copper layers 20 and 22 may be formed at a thickness ratio of about 1:0.8 to about 1:1.2. For example, the first and second copper layers 20 and 22 may be formed at a thickness ratio of about 1:1 to about 1:1.2.

In the above-described clad metal bus bar, the thickness ratio of the first or second cooper layer 20 or 22 to the aluminum layer 10 may exceed about 1. In the above-described range, the bus bar in accordance with the embodiment of the present invention may secure properties such as electrical resistance and tightening torque. For example, the thickness ratio may be set in the range of about 3 to about 8. For example, the thickness ratio may be set to about 1, 2, 3, 4, 5, 6, 7, or 8.

The clad metal bus bar 100 in accordance with the embodiment of the present invention may be manufactured through an extrusion method, a pull-out method, a rolling method, or a combination thereof. For example, the clad metal bus bar 100 may be manufactured through the rolling method, in consideration of the aluminum material, the copper material, and the adhesive properties thereof.

The rolling method may be performed through a typical heat treatment. At this time, the temperature of the heat treatment may range from the room temperature to the fusion points of aluminum and copper. For example, the temperature of the heat treatment may be set in the range of about 200° C. to about 400° C.

Specifically, the rolling method may be performed as follows. First, copper may be stacked on both surfaces of an aluminum body so as to form a stacked structure. Then, the stacked structure may be put into an electric furnace in which a reducing atmosphere, an inert atmosphere, or a vacuum atmosphere is maintained, and hot-rolled at a proper temperature so as to form a bus bar including a clad metal layer 50. The clad metal layer 50 may include a first copper layer, an aluminum layer, and a second copper layer which are completely attached and integrated with each other.

At this time, an additional heat treatment may be performed. Specifically, the rolled bus bar may be put into the electric furnace in which a reducing atmosphere, inert atmosphere, or vacuum atmosphere is maintained, and heated at a proper temperature for a predetermined time. Then, the interfacial bonding force between aluminum and copper may be increased to improve the mechanical property of the bus bar. When the clad metal bus bar including the first copper layer, the aluminum layer, and the second copper layer is manufactured through the rolling method, the rolling process may be performed at room temperature. However, the rolling process may be performed in the range of about 200° C. to about 400° C., such that the first copper layer, the aluminum layer, and the second copper layer are more easily bonded to each other.

In one embodiment, the clad metal bus bar 100 may have a thickness of about 0.5 mm to about 2.5 mm. Furthermore, based on the entire thickness of the clad metal bus bar 100, the thickness of the aluminum layer 10 may be set in the range of about 0.3 mm to about 2.0 mm, the thickness of the first copper layer 20 may be set in the range of about 0.05 mm to about 0.5 mm, and the thickness of the second copper layer 22 may be set in the range of about 0.05 mm to about 0.5 mm.

In a specific embodiment, the clad metal bus bar 100 may have an electrical conductivity of about 60 IACS % or more. Here, IACS stands for "International Annealed Copper Standard", and is a unit of electrical conductivity based on the electrical conductivity of pure copper, which is set to 100% IACS at a temperature of 20° C. In the above-described range, the clad metal bus bar may secure corrosion resistance, electrical conductivity, and tightening torque at the same time, while the lightweight property and economic efficiency thereof are improved. For example, the clad metal bus bar may have an electrical conductivity of about 60 IACS % to about 85 IACS %. In one embodiment, the clad metal bus bar may have an electrical conductivity of about 65 IACS % to about 85 IACS %. In a specific embodiment, the clad metal bus bar may have an electrical conductivity of about 60, 61, 63, 64, 65, 66, 67, 68, 69, 70, 71, 72, 73, 74, 75, 76, 77, 78, 79, 80, 81, 82, 83, 84 or 85 IACS %.

The weight of the clad metal bus bar for a film capacitor in accordance with the embodiment of the present invention may be reduced by about 40% in comparison to the existing bus bar formed of copper, and the cost of the clad metal bus bar may be reduced by about 15% in comparison to the existing bus bar.

Figure 2:
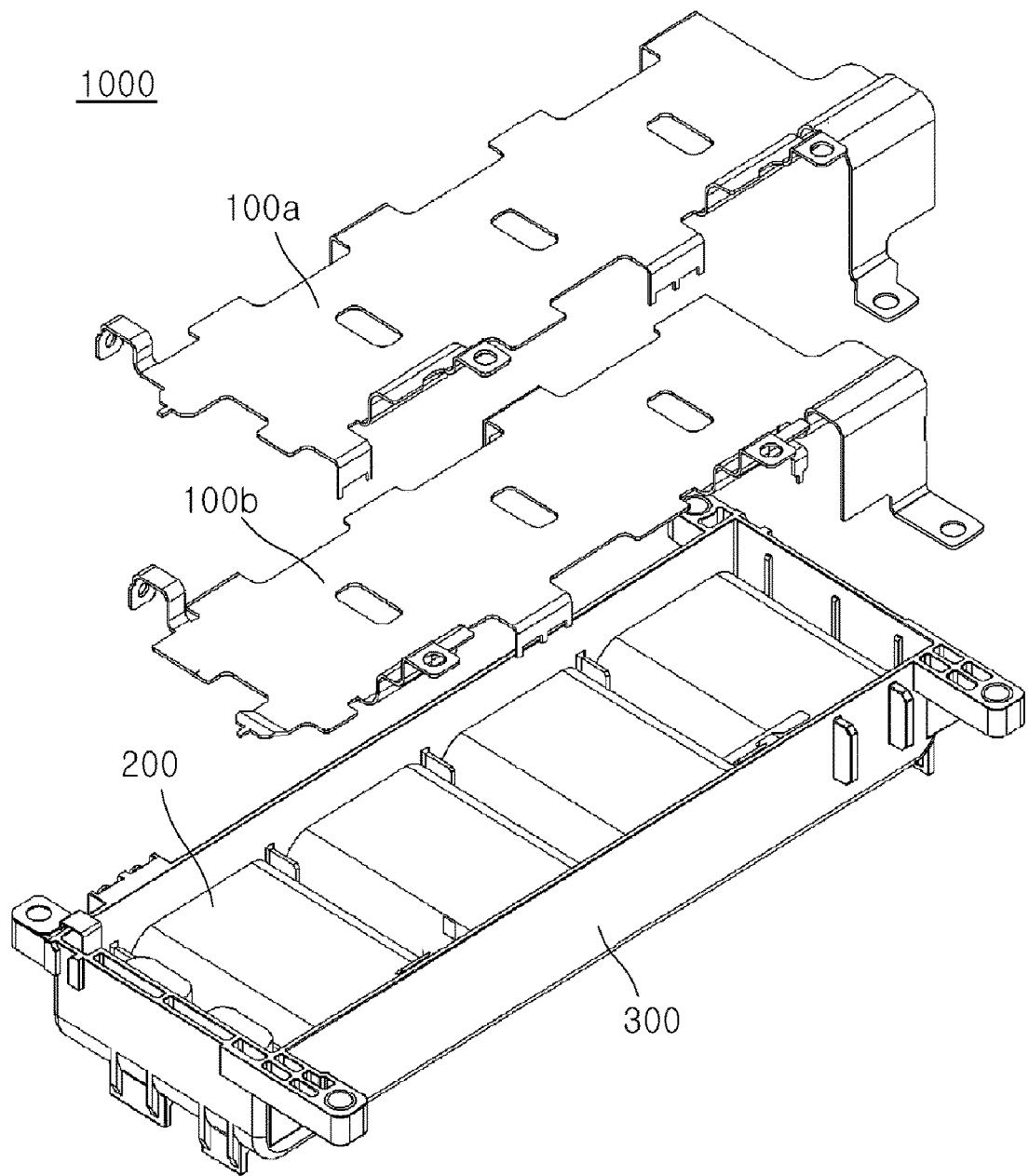
FIG. 2 is an exploded perspective view of a film capacitor in accordance with one embodiment of the present invention.

Another aspect of the present invention relates to a film capacitor including the clad metal bus bar. FIG. 2 is an exploded perspective view of a film capacitor in accordance with an embodiment of the present invention. Referring to FIG. 2, the film capacitor 100 may include a case 300, a plurality of capacitor elements 200 housed in the case 300, a P-pole bus bar 100*a* or 100*b*, and an N-pole bus bar 100*b* or 100*a*. One or more of the P-pole bus bar and the N-pole bus bar may include the clad metal bus bar in accordance with the embodiment of the present invention.

The film capacitor 1000 may be manufactured through a typical method. In a specific embodiment, the plurality of capacitor elements 200 may be coupled to the N-pole bus bar 100*a* or 100*b* and the P-pole bus bar 100*b* or 100*a* which have different polarities, and inserted into the case 300. Then, in order to protect and insulate the inside of the capacitor, the capacitor may be filled with a molding material such as epoxy or urethane.

In a specific embodiment, the capacitor elements 200 may be manufactured through a typical method. For example, a deposited film may be manufactured by depositing a metal on one surface or both surfaces of a dielectric plastic film, and then stacked or wound. Then, a metal layer may be formed on the stacked or wound deposited film. In a specific embodiment, the dielectric plastic film may include one or more of polyethylene terephthalate (PET), polypropylene (PP), polyethylene naphthalate (PEN), polycarbonate (PC), and polyphenylene sulfide (PPS). In a specific embodiment, the metal layer may be formed by metalizing or spaying one or more of zinc, zinc alloy, arsenic, and zinc-arsenic.

Then, in order to protect and insulate the inside of the film capacitor 1000, the film capacitor 1000 may be filled with a molding material such as epoxy or urethane or a multilayer of heterogeneous molding materials such as epoxy and urethane.

The ESR of the film capacitor 1000, measured at 10 kHz through an automatic current regulator (LCR meter), may range from about 0.1 mΩ to about 3.5 mΩ. In the above-described range, the film capacitor 1000 may have an excellent electrical property. For example, the film capacitor 1000 may have an ESR of about 0.5 mΩ to about 2.0 mΩ. In a specific embodiment, the film capacitor 1000 may have an ESR of about 0.1, 0.2, 0.3, 0.4, 0.5, 0.6, 0.7, 0.8, 0.9, 1.0, 1.5, 2.0, 2.5, 3.0 or 3.5 mΩ.

Hereinafter, the components and operations of the embodiments of the present invention will be described in detail with reference to the accompanying drawings. However, the embodiments of the present invention are proposed as embodiments of the present invention, and the present invention is not limited thereto.

Since components and operations which are not described herein can be sufficiently inferred by those skilled in the art, the detailed descriptions thereof are omitted herein.

EXAMPLES AND COMPARATIVE EXAMPLES

Examples 1 to 4

A pure copper plate such as C1100 was stacked over a pure aluminum plate such as A1050. Then, the stacked structure was put into an electric furnace in which the atmosphere is maintained at a temperature of 200° C. to 400° C., heated for one hour, and hot-rolled at a percentage reduction in thickness of 0% (annealed material) to 8% so as to form a material including a clad metal layer having a thickness of 1 mm. Then, a bus bar for a film capacitor, to which the material including the clad metal layer is applied, was manufactured. The clad metal layer may include first and second copper layers which are formed on both surfaces of an aluminum layer at a thickness ratio of Table 1 below.

Comparative Example 1

A bus bar formed of typical copper such as C1100 was used as a bus bar in accordance with the comparative example 1. The bus bar may have a thickness of 1 mm.

Comparative Examples 2 to 6

Clad metal bus bars in accordance with the comparative examples 2 to 6 were manufactured in the same manner as the example 1, except that a percentage reduction in thickness was applied as shown in Table 1, and a clad metal layer was formed to include first and second copper layers which are formed on both surfaces of an aluminum layer at the thickness ratio of Table 1.

EXPERIMENTAL EXAMPLE

The following properties were evaluated for the bus bars in accordance with the examples 1 to 4 and the comparative examples 1 to 6.

(1) Elongation percentage (%): the elongation percentages of the bus bars in accordance with the examples 1 to 4 and the comparative examples 1 to 6 were measured on the basis of ISO 6892, and the measurement results are shown in Table 1 below.

(2) Bond strength (kgf/25 mm): the bond strengths of the bus bars in accordance with the examples 1 to 4 and the comparative examples 1 to 6 were measured for a specimen width 25 mm on the basis of ISO 11339, and the measurement results are shown in Table 1 below.

(3) Tensile strength (MPa): the tensile strengths of the bus bars in accordance with the examples 1 to 4 and the comparative examples 1 to 6 were measured on the basis of ISO 6892, and the measurement results are shown in Table 1 below.

(4) Hardness (Hv): the hardnesses of the bus bars in accordance with the examples 1 to 4 and the comparative examples 1 to 6 were measured through a Vickers hardness tester, and the measurement results are shown in Table 1 below.

(5) Bus bar weight (1 set, g): the weights of the bus bars in accordance with the examples 1 to 4 and the comparative examples 1 to 6 were measured through a typical method, and the measurement results are shown in Table 1 below.

(6) Electrical conductivity (IACS %): the electrical conductivities of the bus bars in accordance with the examples 1 to 4 and the comparative examples 1 to 6 were measured, and the measurement results are shown in Table 1 below. At this time, IACS stands for "International Annealed Copper Standard", and is a unit of electrical conductivity based on the electrical conductivity of pure copper, which is set to 100% IACS at a temperature of 20° C.

(7) Electrical resistance (μΩ): the electrical resistances across the bus bars in accordance with the examples 1 to 4 and the comparative examples 1 to 6 were measured at 10 KHz through an automatic current regulator (LCR), and the measurement results are shown in Table 1 below.

(8) Tightening torque: it was observed whether a crack or damage occurred when a force of 10N·m was applied to the bus bars in accordance with the examples 1 to 4 and the comparative examples 1 to 6, in order to tighten a bolt. When the bolt was tightened without a crack or damage, it was determined as ○, and when a crack or damage occurred, it was determined as x. The determination results are shown in Table 1 below.

(9) Temperature rise test: film capacitors including the bus bars in accordance with the examples 1 to 4 and the comparative examples 1 to 6, respectively, were manufactured, and the temperature rises of the bus bars were measured. The measurement results are shown in Table 1 below.

(10) Bending test: it was determined whether a crack occurred when a L-shaped bending test, a Z-shaped bending test, and bending tests for radius curvatures of 0.5, 1.0, 1.5, and 2.0 were performed for the bus bars in accordance with the examples 1 to 4 and the comparative examples 1 to 6. When no crack occurred, it was determined as ○, and when a crack occurred, it was determined as x. The determination results are shown in Table 1 and FIG. 4.

(11) Analysis for interface between copper layer and aluminum layer before and after thermal shock test: the thermal shock test was performed during 750 cycles, during each of which the bus bars in accordance with the examples 1 to 4 and the comparative examples 1 to 6 are left at −40° C. for one hour and then left at 105° C. for one hour, and it was observed whether interface debonding and crack propagation into another metal interface occurred. When the interface debonding and crack propagation did not occur, it was determined as ○, when the interface debonding and crack propagation occurred, it was determined as x. The determination results are shown in Table 1 and FIG. 5.

(12) Analysis for interface between copper layer and aluminum layer after heat treatment: after the bus bars in accordance with the examples 1 to 4 and the comparative examples 1 to 6 were heat-treated for one our, a compound layer formed at the interface between the copper layer and the aluminum layer was observed, and the cross-sectional thickness of the interface layer was measured. The measurement results are shown in Table 1 and FIG. 6.

(13) Equivalent Series Resistance (ESR): film capacitors including the bus bars in accordance with the examples 1 to 4 and the comparative examples 1 to 6, respectively, were manufactured, a thermal shock test was performed during 750 cycles, and ESRs of the film capacitors were measured at 10 kHz through an automatic current regulator (LCR meter). The measurement results are shown in Table 1 below.

TABLE 1

| | | Examples | | | | Comparative Examples | | | | | |
|---|---|---|---|---|---|---|---|---|---|---|---|
| | | 1 | 2 | 3 | 4 | 1 | 2 | 3 | 4 | 5 | 6 |
| Percentage reduction in thickness (%) | | 0 | 8 | 0 | 8 | — | 20 | 20 | 20 | 10 | 30 |
| Elongation percentage (%) | | 30 | 28 | 29 | 32 | 32 | 15 | 13 | 4 | 18 | 5 |
| Bond strength (kgf/25 mm) | | 14 | 12 | 15 | 16 | — | 6 | 5 | 3 | 5 | 8 |
| Entire thickness (mm) of bus bar | | 1 | 1 | 1 | 1 | 1 | 1 | 1 | 1 | 1 | 1 |
| Thickness ratio of clad metal layer (%) | First copper layer | 15 | 10 | 15 | 25 | — | 35 | 15 | 5 | 15 | 15 |
| | Aluminum layer | 70 | 80 | 65 | 50 | — | 30 | 70 | 90 | 70 | 70 |
| | Second copper layer | 15 | 10 | 20 | 25 | — | 35 | 15 | 5 | 15 | 15 |
| Tensile strength (MPa) | | 142 | 157 | 144 | 251 | 271 | 245 | 182 | 165 | 154 | 204 |
| Hardness (Hv) | | 65 | 76 | 58 | 81 | 90 | 82 | 79 | 81 | 78 | 89 |
| Bus bar weight (1 set, g) | | 194 | 168 | 207 | 247 | 379 | 300 | 195 | 141 | 194 | 196 |
| Electrical conductivity (IACS %) | | 73 | 65 | 75 | 81 | 98 | 89 | 73 | 65 | 73 | 72 |
| Electrical resistance (μΩ) of bus bar | | 191 | 190 | 191 | 190 | 190 | 190 | 190 | 210 | 191 | 190 |
| Tightening torque | | ○ | ○ | ○ | ○ | ○ | ○ | ○ | X | ○ | X |
| Temperature rise (° C.) | | 7 | 7 | 7 | 7 | 7 | 7 | 7 | 9 | 7 | 7 |
| L-shaped bending test | | ○ | ○ | ○ | ○ | ○ | x | x | x | ○ | x |
| Z-shaped bending test | | ○ | ○ | ○ | ○ | ○ | x | x | x | x | x |
| Bending test for radius curvatures (R) | R = 0.5 | ○ | ○ | ○ | ○ | ○ | x | x | x | x | x |
| | R = 1.0 | ○ | ○ | ○ | ○ | ○ | x | x | x | x | x |
| | R = 1.5 | ○ | ○ | ○ | ○ | ○ | x | x | x | ○ | x |
| | R = 2.0 | ○ | ○ | ○ | ○ | ○ | x | x | x | ○ | x |
| Analysis for interface before and after thermal shock test | | ○ | ○ | ○ | ○ | ○ | x | x | x | x | x |
| Thickness of interface layer after heat treatment at 200° C. for 1 hr | | — | — | — | — | 5 | 5 | 6 | 6 | 7 | 7 |
| ESR after thermal shock test | | 0.9 | 1.0 | 0.9 | 0.9 | 0.9 | 4.8 | 4.3 | 4.8 | 4.2 | 4.8 |

As shown in Table 1, the bus bars in accordance with the examples 1 to 4 of the present invention have a lower ESR than the comparative examples 2 to 6, and have a smaller weight than the existing bus bar formed of copper, while the electrical resistances, the tightening torques, and the temperature rises thereof are similar to those of the existing bus bar formed of copper.

Furthermore, the comparative examples 2 to 4 which deviate from the thickness ratio of the aluminum layer to the first or second copper layer in the embodiments of the present invention cannot acquire a lightweight property, or do not have the same electrical resistance, tightening torque, and temperature rise as the existing bus bar formed of copper. Thus, the comparative examples 2 to 4 could not realize the effect in accordance with the embodiments of the present invention. The comparative example 1 manufactured of copper has a large weight than the examples 1 to 4. In the case of the comparative examples 2 and 3 of which the percentage reduction in thickness deviates from those of the embodiments of the present invention, the elongation percentages and bonding strengths thereof were degraded, and a crack occurred during bending test.

FIGS. 4A to 4D illustrate bending test results of the examples 1 and 2 and the comparative examples 2 and 3, when the radius curvature R is set to 0.5. Referring to Table 1 and FIGS. 4A to 4D, no crack occurred during the bending tests for the bus bars in accordance with the embodiments of the present invention. However, cracks occurred in the comparative examples 2 to 6 in which the thickness ratio of the aluminum layer to the first or second copper layer deviates from those of the embodiments of the present invention, or of which the percentage reduction in thickness deviates from those of the embodiments of the present invention.

FIGS. 5A and 5B are photographs showing the cross-sections of the bus bars in accordance with the embodiments of the present invention, before and after the thermal shock test, and FIGS. 5C and 5D are photographs showing the cross-sections of the bus bars in accordance with the comparative examples, before and after the thermal shock test. Referring to Table 1 and FIGS. 5A to 5D, interface debonding occurred at the interface between the copper layer and the aluminum layer and crack propagated to the interface of the other metal layer, in the bus bars in accordance with the comparative examples 2 to 6 in which the thickness ratio of the aluminum layer to the first or second copper layer deviates from those of the embodiments of the present invention, or of which the percentage reduction in thickness deviates from those of the embodiments of the present invention.

FIG. 6A is a photograph showing the interface between the copper layer and the aluminum layer in the bus bar in accordance with the example 1 after a heat treatment, FIG. 6B is a photograph showing the interface between the copper layer and the aluminum layer in the bus bar in accordance with the example 2 after a heat treatment, FIG. 6C is a photograph showing the interface between the copper layer and the aluminum layer in the bus bar in accordance with the example 3 after a heat treatment, and FIG. 6D is a photograph showing the interface between the copper layer and the aluminum layer in the bus bar in accordance with the comparative example 3 after a heat treatment. Referring to Table 1 and FIGS. 6A to 6D, no compound layer was formed at the interfaces in the examples 1 to 4 of the present invention. However, a compound layer was formed in the comparative examples 2 to 6 in which the thickness ratio of the aluminum layer to the first or second copper layer deviates from those of the embodiments of the present invention, or of which the percentage reduction in thickness deviates from those of the embodiments of the present invention.

When the bus bar is heated through resistance heat or used in a high-temperature environment, a metallic compound composed of aluminum and copper with high brittleness may be formed at the interface. In this case, the electrical conductivity, the reliability, and the lifetime of the bus bar may be reduced.

Although embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A clad metal bus bar for a film capacitor, comprising a clad metal layer comprising:
    an aluminum layer;
    a first copper layer stacked on one surface of the aluminum layer; and
    a second copper layer stacked on the other surface of the aluminum layer,
    wherein the thicknesses of the first and second copper layers are set in the range of about 10% to about 25% of the entire thickness of the clad metal layer, and the thickness of the aluminum layer is set in the range of about 50% to about 70% of the entire thickness of the clad metal layer, and
    the clad metal layer has a percentage reduction in thickness of less than about 10% and an elongation percentage of about 25% or more, and the bond strength of the clad metal layer, measured on the basis of ISO 11339, is equal to or higher than about 10 kgf or more, based on a specimen width of 25 mm.

2. The clad metal bus bar of claim 1, wherein the thickness ratio of the first copper layer to the second copper layer is set in the range of about 1:0.5 to about 1:1.5.

3. The clad metal bus bar of claim 1, wherein the thicknesses of the first and second copper layers are set in the range of about 15% to about 25% of the entire thickness of the clad metal layer, and the cross-sectional thickness of the aluminum layer is set in the range of about 50% to about 65% of the entire thickness of the clad metal layer.

4. The clad metal bus bar of claim 1, wherein the thickness ratio of the first or second copper layer to the aluminum layer is set in the range of about 1:3 to about 1:8.

5. The clad metal bus bar of claim 1, wherein the first and second copper layers have a thickness of about 0.05 mm to about 0.5 mm, and the aluminum layer has a thickness of about 0.3 mm to about 2.0 mm.

6. The clad metal bus bar of claim 1, wherein the clad metal bus bar has a thickness of about 0.5 mm to about 2.5 mm.

7. The clad metal bus bar of claim 1, wherein the ratio of the percentage reduction in thickness to the elongation percentage of the clad metal layer is set in the range of about 1:2 to about 1:15.

8. The clad metal bus bar of claim 1, wherein the clad metal bus bar has an electrical conductivity of about 60 IACS % or more.

9. The clad metal bus bar of claim 1, wherein the clad metal layer has an elongation percentage of about 25% to about 35%.

10. A film capacitor comprising the clad metal bus bar of claim 1.

* * * * *